US009122836B2

(12) United States Patent
Fu et al.

(10) Patent No.: US 9,122,836 B2
(45) Date of Patent: Sep. 1, 2015

(54) RECOGNITION OF TEMPLATE PATTERNS WITH MASK INFORMATION

(71) Applicant: Taiwan Semiconductor Manufacturing Co., Ltd., Hsin-Chu (TW)

(72) Inventors: Chung-Min Fu, Chungli (TW); Yung-Fong Lu, Keelung (TW); Wen-Ju Yang, Hsinchu (TW); Chin-Chang Hsu, Banqiao (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/251,696

(22) Filed: Apr. 14, 2014

(65) Prior Publication Data
US 2014/0223391 A1 Aug. 7, 2014

Related U.S. Application Data

(63) Continuation of application No. 13/303,374, filed on Nov. 23, 2011, now Pat. No. 8,726,200.

(51) Int. Cl.
*G06F 17/50* (2006.01)
*G03F 1/70* (2012.01)

(52) U.S. Cl.
CPC .............. *G06F 17/5081* (2013.01); *G03F 1/70* (2013.01)

(58) Field of Classification Search
CPC ............. G06F 17/30; G06F 17/50; H02J 7/00
USPC ............................................. 716/52; 320/52
See application file for complete search history.

(56) References Cited

U.S. PATENT DOCUMENTS

| 6,195,593 | B1 | 2/2001 | Nguyen | |
|---|---|---|---|---|
| 6,477,694 | B1 * | 11/2002 | Irino et al. | 716/115 |
| 6,519,741 | B2 * | 2/2003 | Yaguchi et al. | 716/115 |
| 6,708,316 | B2 | 3/2004 | Madni et al. | |
| 6,954,921 | B2 * | 10/2005 | Hassibi et al. | 716/103 |
| 7,509,608 | B1 * | 3/2009 | Duong | 716/113 |

(Continued)

OTHER PUBLICATIONS

Kang, J.H. et al., "Combination of rule and pattern based lithography unfriendly pattern detection in OPC flow", Proc. of SPIE, 2008, 7122, pp. 1-8.

(Continued)

*Primary Examiner* — Mohammed Alam
(74) *Attorney, Agent, or Firm* — Duane Morris LLP; Steven E. Koffs

(57) ABSTRACT

Apparatus includes a machine readable storage medium for storing a template library having at least one template. The template is to include a first layout representation of at least one pattern to be formed by multi-patterning a single layer of an IC. The pattern has a plurality of portions to be formed using a plurality of respectively different photomasks. The first layout representation includes data identifying on which photomask each portion is to be located. An electronic design automation (EDA) tool includes a processor configured to receive a hardware description language representation of at least a part of a circuit and generate a second layout representation of the part of the circuit having a plurality of polygons. The EDA tool has a matching module that identifies and outputs an indication of whether one or more of the plurality of portions matches a subset of the plurality of polygons.

20 Claims, 8 Drawing Sheets

(56) References Cited

U.S. PATENT DOCUMENTS

| | | |
|---|---|---|
| 7,685,555 B1 | 3/2010 | Bertrand et al. |
| 2002/0108095 A1* | 8/2002 | Barney et al. .................. 716/10 |
| 2006/0107240 A1* | 5/2006 | Pikus et al. ....................... 716/2 |
| 2006/0200789 A1* | 9/2006 | Rittman ........................ 716/19 |
| 2007/0157140 A1* | 7/2007 | Holesovsky et al. ............. 716/5 |
| 2007/0226659 A1* | 9/2007 | Suaya et al. ..................... 716/1 |
| 2008/0288907 A1* | 11/2008 | Laing ............................ 716/14 |
| 2010/0037200 A1 | 2/2010 | Ghan et al. |
| 2011/0023002 A1* | 1/2011 | Cheng et al. .................. 716/126 |
| 2011/0239168 A1* | 9/2011 | Lei et al. ......................... 716/51 |
| 2011/0302546 A1 | 12/2011 | Mottaez et al. |
| 2011/0302547 A1 | 12/2011 | Mottaez |
| 2012/0054709 A1 | 3/2012 | Tsai |
| 2012/0102440 A1* | 4/2012 | Sweis ............................. 716/53 |
| 2012/0121160 A1* | 5/2012 | Matsuoka et al. ............ 382/145 |
| 2013/0132913 A1* | 5/2013 | Fu et al. .......................... 716/51 |
| 2014/0195999 A1* | 7/2014 | Nakamoto .................... 716/133 |

OTHER PUBLICATIONS

Smith, Stephane L. et al., "Post-Lithography Layout Prediction Based on Pattern Matching of Primitive Structures", Optimization Issues in VLSI CAD, Fall 2007, pp. 1-4.

Bencher, C., "An Assessment of Patterning Options for 15nm Half-Pitch", International Symposium on VLSI Technology, Systems and Applications (VLSI-TSA), Apr. 2011, pp. 1-2.

"Calibre Pattern Matching", Physical Verification Datasheet, 2010, Mentor Graphics Corporation, 2 pages, www.memtor.com.

* cited by examiner

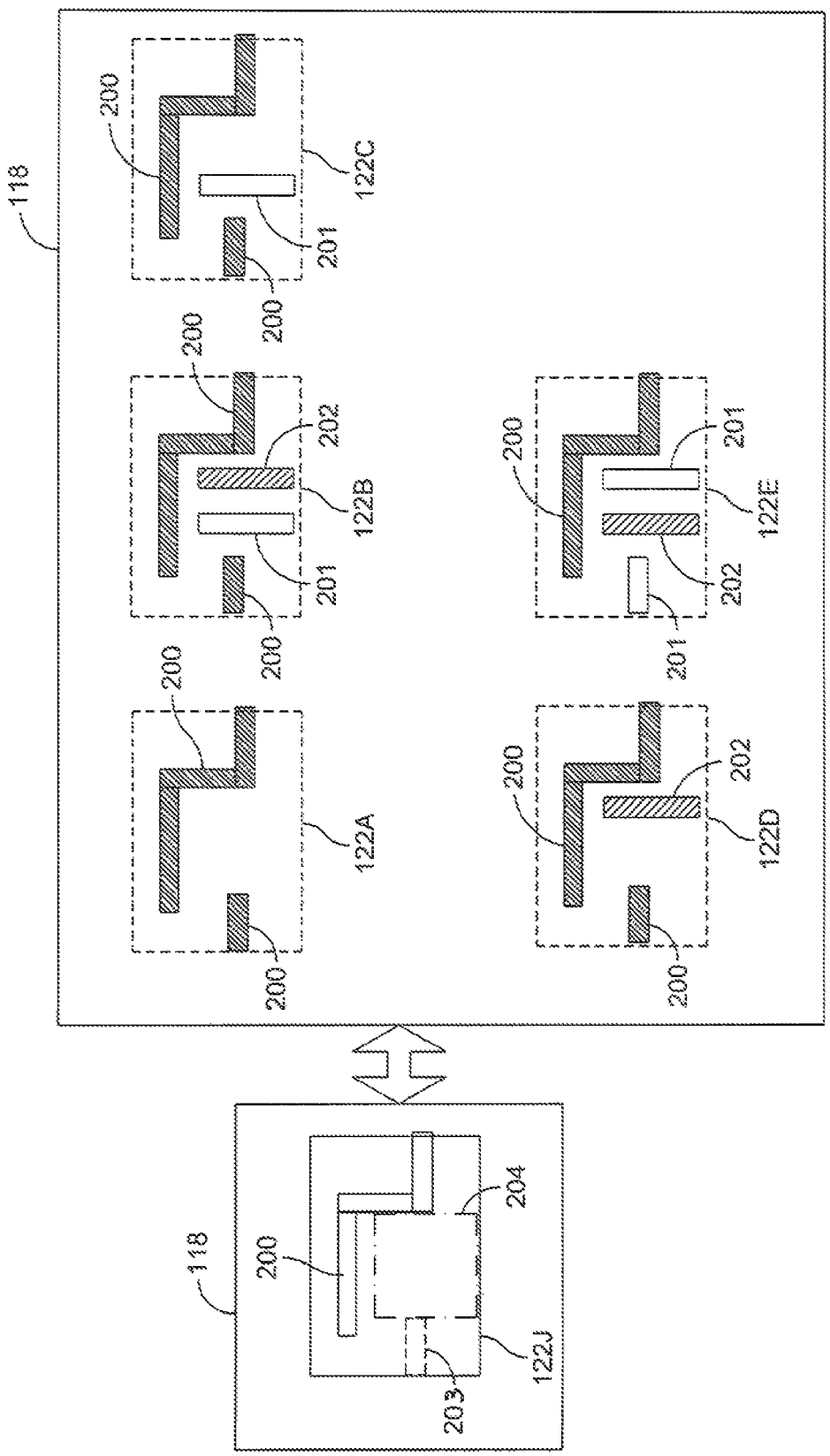

RECOGNITION OF TEMPLATE PATTERNS WITH MASK INFORMATION

PRIORITY CLAIM AND CROSS-REFERENCE

This application is a continuation of U.S. patent application Ser. No. 13/303,374, filed Nov. 23, 2011, which is incorporated by reference herein in its entirety.

FIELD

This disclosure relates to semiconductor fabrication generally, and more specifically to electronic design automation tools for forming photomasks.

BACKGROUND

Electronic design automation (EDA) tools are special purpose processors which execute programs used for designing electronic circuits such as printed circuit boards and integrated circuits (IC). Modern EDA tools provide a suite of applications that chip designers use to design, simulate, analyze, and verify semiconductor chips, and create a GDSII bit stream suitable for inputting to the photomask generation process.

The designers create functional circuit designs that may be expressed in a technology independent gate-level hardware description language (HDL), such as Verilog. A logic synthesis program converts the HDL design into a standard netlist format. The design is provided to a place and route tool.

Some EDA tools provide the capability to identify components in an IC design that can be replaced with reusable circuit components, such as elemental cells or more complex macros, which are functionally equivalent to the component being replaced. For example, the EDA tool vendor or a third party may provide an "IP Library" of standard cell designs, and the tool may permit individual users to create their own templates. Improved use of reusable components reduces the total design and verification cycle.

BRIEF DESCRIPTION OF THE DRAWINGS

FIG. 2a schematically shows an example of the operation of the system using a wildcard region, according to some embodiments.

DETAILED DESCRIPTION

This description of the exemplary embodiments is intended to be read in connection with the accompanying drawings, which are to be considered part of the entire written description.

The inventors have discovered that EDA tools and design process flows can be improved by inclusion of multi-patterning decomposition (mask assignment) information in reusable library templates, and by matching an IC design against the predetermined patterns in the library templates, including the mask assignment information, to select a template for inclusion in the final IC design.

Figure 1:
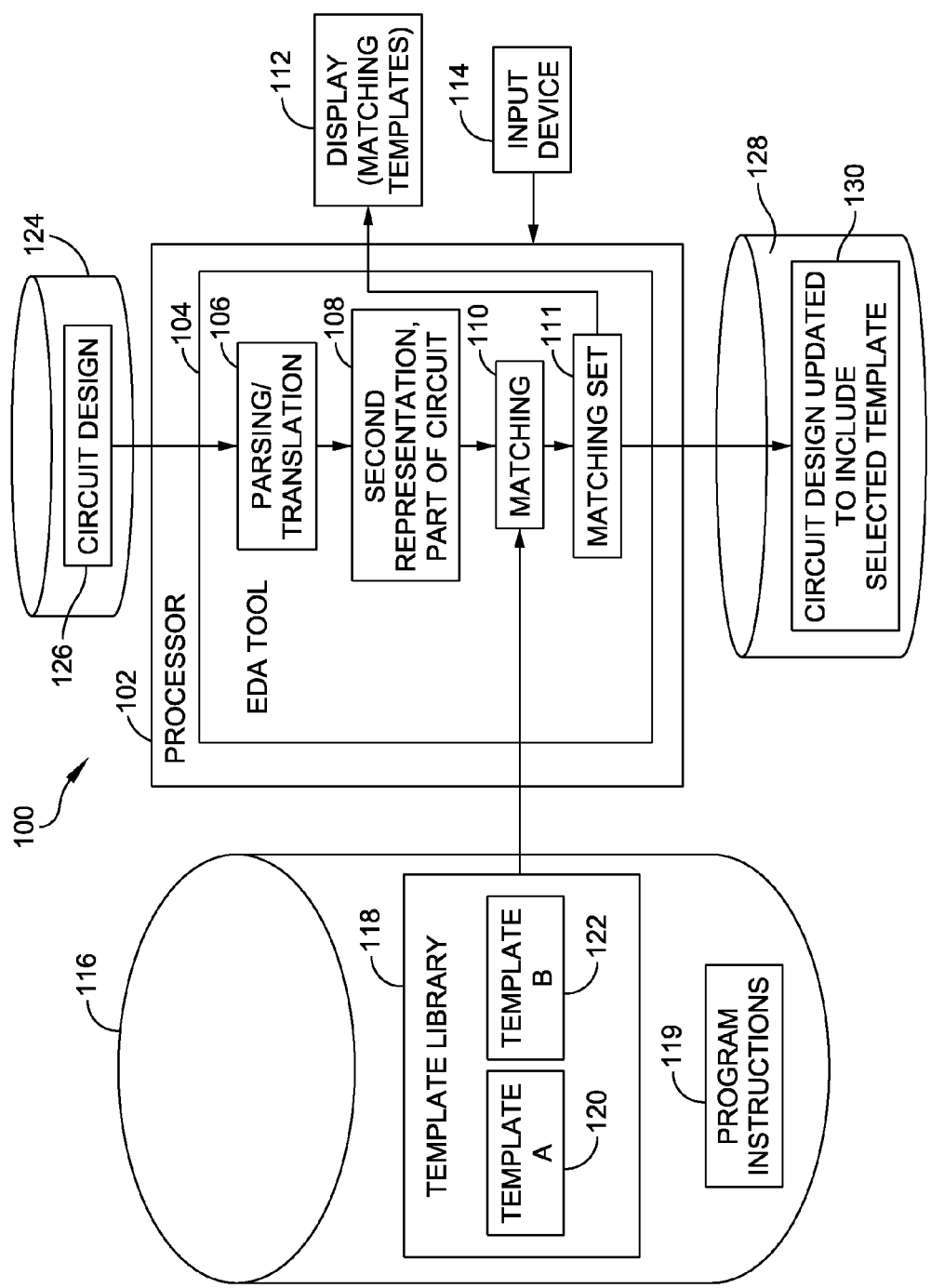
FIG. 1 is a block diagram of an EDA system, according to some embodiments.

FIG. 1 is a block diagram of an apparatus 100. In some embodiments, the EDA tool is implemented by programming a general purpose processor 102 with software 104 to create a special purpose processor. Although FIG. 1 schematically shows a single processor, the various applications described below may be implemented in one or more processors. If multiple processors are included, the various functions may be apportioned among the processors in any desired fashion, for example, to improve speed or efficiency.

At least one persistent machine readable storage medium 116 is provided for storing a template library 118 having at least one template 120, 122. In various embodiments, the template library may include reusable pattern templates created by a user, patterns provided by the EDA tool vendor, patterns created by an IP cell library designer, or any combination of these three sources At least one template 120, 122 includes a first layout representation of at least one pattern to be formed by multi-patterning a single layer of an IC. The layer may be a front end of line (FEOL) layer, such as an oxide or diffusion, or the layer may be a back end of line (BEOL) layer, such as a dielectric, metal or via layer. For example, the first layout representation may be a GDSII bit stream or OASIS bit stream representation of the pattern. The multi-patterning allows two or more patterns to be formed on single layer of an IC using multiple exposures, where the set of patterns are too close together to be clearly formed using a single mask.

In some embodiments, the template library 118 is stored in the same storage medium 116 in which software program instructions 119 executed by the processor 102 are stored. In other embodiments, the software and template library 118 are stored in separate media from each other.

Figure 2:
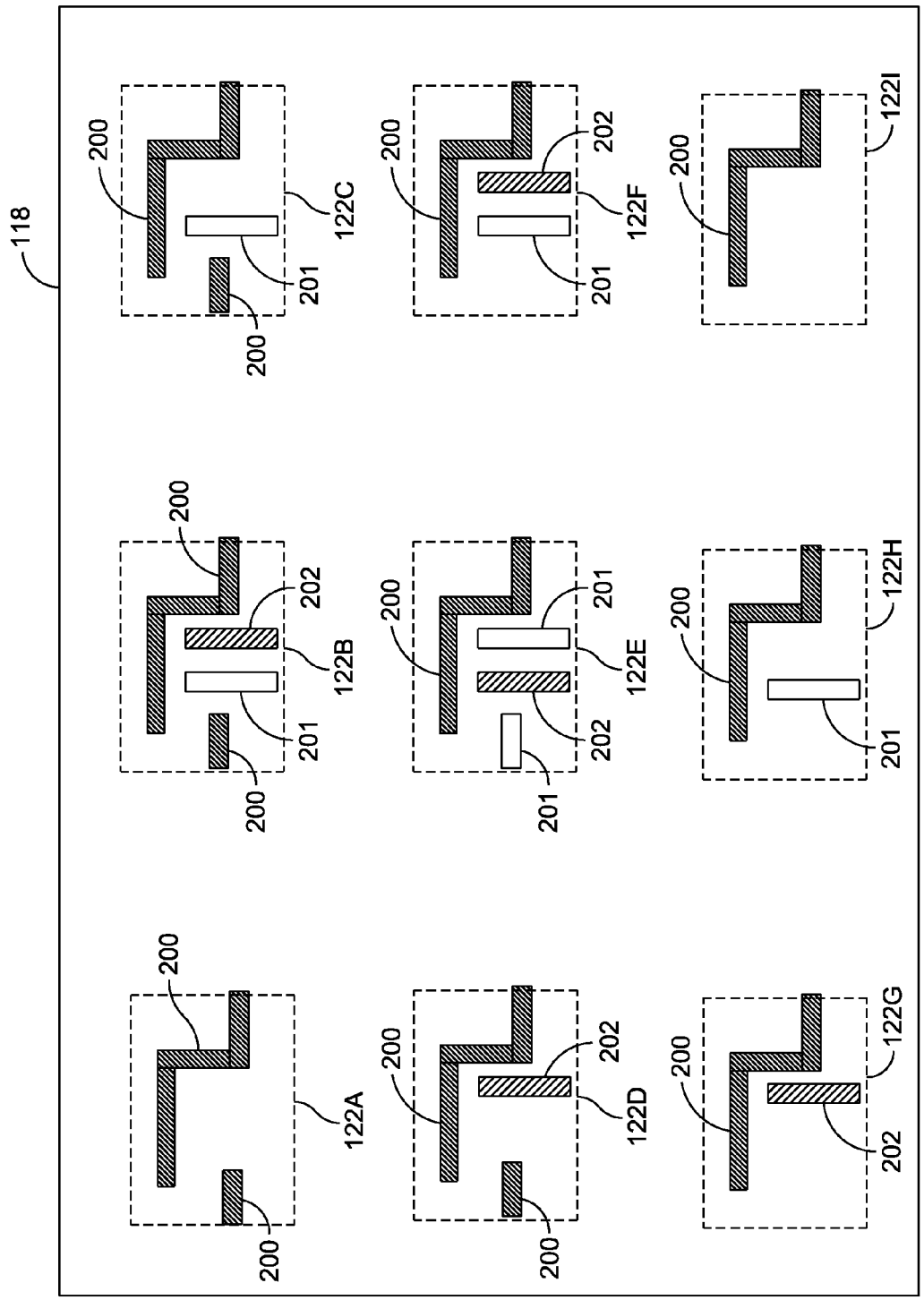
FIG. 2 is a schematic diagram of the template library shown in FIG. 1, according to some embodiments.

FIG. 2 is a schematic diagram of the template library 118, or a portion of the library. Although FIG. 2 represents each template 122A-122I by a graphical representation, this is for ease of illustration, and other representations (such as a GDSII or OASIS bit stream representation) may be used. Each pattern (except for pattern 122I) has a plurality of portions to be formed using a plurality of respectively different photomasks.

The first layout representation includes data identifying on which photomask each portion of the pattern is to be located. In templates 122A-122I of FIG. 2, each grayscale level and corresponding reference numeral 200-202 represents patterns formed on a respectively different mask. Thus, the reference numerals 200-202 do not correspond to specific polygons, but rather represent photomask assignments of the various patterns. All polygons numbered 200 are formed by a first photomask, all polygons numbered 201 are formed by a second photomask, and all polygons numbered 202 are formed by a third photomask. In FIG. 2, the templates 122A-122I all exactly represent various combinations of a few simple polygons implemented in one, two or three photomasks. One of ordinary skill understands that the template library may contain many different configurations of polygons, with many different implementations of photomask assignments, and different numbers of photomasks.

In some embodiments, polygons of the template can include polygon presence and coloring constraints for fuzzy matching purposes. For example, in FIG. 2a, besides the polygon combination in template 122J, the user can further assign a "don't care" polygon occurrence constraint in the dashed region numbered 204 and another coloring constraint that polygon 203 must be included in the first or second photomask. The "don't care" region 204 is a wildcard region, in that the presence or absence of a pattern in region 204 is not considered when determining whether a template 122J matches any of the library templates. This will imply that patterns which match to any of the templates 122A-122E will also match to the template 122J.

In various embodiments, the mask assignment information is captured in a variety of formats. The mask assignment information may be captured in tags, text, attributes, or metadata associated with each pattern in the template. Thus, a variety of data structures may be used. In some embodiments, the patterns are assigned to "hyper layers" which correspond one-to-one with the respective photomasks used for multi-patterning a single layer. For example, in template 122B of FIG. 2, there are two polygons 200 assigned to the first mask, one polygon 201 assigned to the second mask, and one polygon 202 assigned to the third mask. By assigning the patterns corresponding to each mask to a respective hyper layer, the design rule checks for each mask are simplified.

Further, the use of hyper layers permits usage of existing tools adapted for use without double patterning, such as for routing circuit traces on a single layer within the constraints of the design rules and technology files for the technology node being used.

Referring again to FIG. 1, an electronic design automation (EDA) tool 100 includes a processor 102 configured to receive a hardware description language representation of at least a part of a circuit and generate a second layout representation of the part of the circuit having a plurality of polygons. The EDA tool 100 may be any of a variety of tools, such as a physical implementation/verification tool, e.g., IC Compiler, or ICValidator by Synopsys of Mountain View, Calif., Cadence System Development Suite e.g., SoC Encounter, Cadence Physical Verification System by Cadence Design Systems of San Jose, Calif., or "OLYMPUS-SOC™" and "CALIBRE® INROUTE" by Mentor Graphics of Wilsonville, Oreg.

The EDA tool 104 is provided with a matching module 110 that identifies and outputs an indication of whether one or more of the plurality of portions of the IC design matches a subset of a plurality of polygons in any of the templates 120, 122 in template library 118. The matching module 110 is configured to cause a display 112 to display each template in a matching set 111 of templates that include the polygons of the part of the IC design 126. In some embodiments, the matching module 110 is configured to cause displaying of each polygon in the part of the circuit 126. For example, in some embodiments, the part of the circuit 126 is displayed in a first part of the display, and the matching set 111 is displayed in a second part of the display. This allows the user to compare the polygons of the part of the IC design 126 and the templates in the matching set and easily determine the best template for process optimization (i.e., the template having all the elements of the part of the circuit design, with the fewest extra elements, and requiring the fewest photomasks).

Alternatively, the user can select a template to modify polygons of the part of the IC design 126 to be unmatched to the worst template (i.e. the template having a risk in the manufacturing process, e.g., polygons belong to different photomasks are too close in some order). For example, where the user (e.g., engineer) is aware that a process has a "weakness" or a substantial likelihood of failure to meet any specification, templates for patterns that are known to produce a bad result may be used. The user can compare any given pattern to one or more of these known patterns, for the purpose of avoiding the use of such pattern. Upon detecting that a part of the IC design 126 matches one of the templates to be avoided, the user can select another design for that part of the IC design.

The tool 104 has an input device 114 (such as a keyboard, mouse, or other pointing device) for selecting one of the templates from the matching set 111, to replace the corresponding part of the IC design 126. The matching module 110 is configured to respond to a selection by a user of one of the displayed templates by replacing the plurality of polygons in the part of the circuit with the selected template. Following the selection, the circuit design 130, including the update to include the selected template, is stored in a persistent machine readable storage medium 128. When all of the template matching is completed, the updated design 130 is ready for further verification, and ultimately, tapeout for fabricating a set of photomasks.

Figure 3:
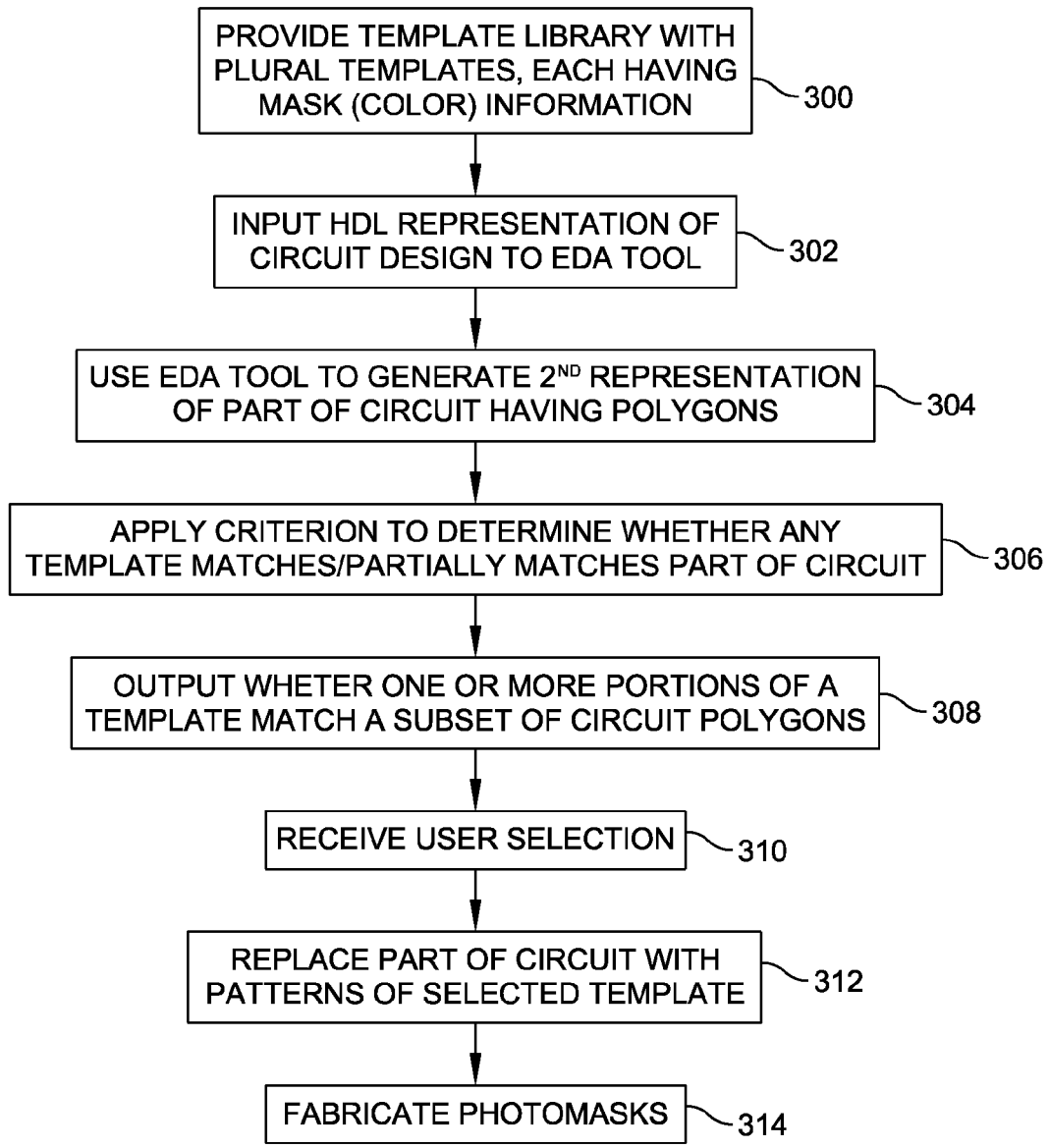
FIG. 3 is a flow chart of a method, according to some embodiments.

FIG. 3 shows a method for template matching.

At step 300, a persistent machine readable storage medium 116 is provided that stores a template library 118 containing at least one template 120, 122 including a first layout representation (e.g., a bitstream representation) of at least one pattern to be formed by multi-patterning a single layer of an IC The pattern has a plurality of portions to be formed using a plurality of respectively different photomasks. The first layout representation includes data identifying on which photomask each portion is to be located. In some embodiments, the template library has a plurality of templates, each including a respective first layout representation of a respective pattern, each pattern having one or more portions to be formed using the plurality of photomasks.

At step 302, a hardware description language representation of at least a part of a circuit 126 is provided to an electronic design automation (EDA) tool 104. For example, the HDL representation 126 may be generated by the place and route module of the EDA tool 104, or a user may input an HDL description.

At step 304 the EDA tool generates a second layout representation (e.g., GDSII or OASIS bit stream) of the part of the circuit 126 having a plurality of polygons. In some embodiments, the second layout representation includes data identifying on which photomask each of the plurality of polygons is to be located.

At step 306, the matching module 110 of the EDA tool 104 applies criteria (discussed with reference to FIG. 4) to determine whether any template matches or partially matches the part of the circuit 126.

At step 308 of FIG. 8, the matching module identifies and outputs an indication of whether one or more of the plurality of portions matches a subset of the plurality of polygons. Module 110 identifying a matching set containing each of the plurality of templates that at least includes patterns matching all of the plurality of polygons in the part of the circuit, regardless of whether the patterns within one of the templates in the matching set are divided among two or more photomasks. In some embodiments, the matching set includes each of the plurality of templates that includes patterns that at least match all of the plurality of polygons in the part of the circuit, regardless of whether any of the individual templates includes a pattern matching all of the plurality of polygons in the part of the circuit within a single photomask.

In some embodiments, where the IC design 126 includes multi-patterning decomposition mask assignment information, the matching set includes each of the plurality of templates that at least includes a pattern matching at least one of the plurality of polygons in the part of the circuit, so long as the template does not include within a single photomask a pattern corresponding to two polygons that are to be located in two different photomasks according to the data of the second layout representation identifying on which photomask each of the plurality of polygons is to be located.

For each template in the matching set, the output may display the part of the IC design 126 on one side of the display, and all of the candidate matching templates on the other side of the display. In some embodiments, the outputting further comprises displaying each polygon in the part of the circuit, and the templates and polygons are each displayed in a manner that identifies on which photomask each portion of each pattern and each polygon of the part of the circuit is to be located.

At step 310, the user enters a selection of one of the templates or revised templates, and the matching module receives the user's selection.

At step 312, the EDA tool replaces the portion of the bit stream representing part of the IC design 126 with a bit stream representation of the selected template or revised template.

At step 314, the photomasks are created, including the selected template.

Figure 4:
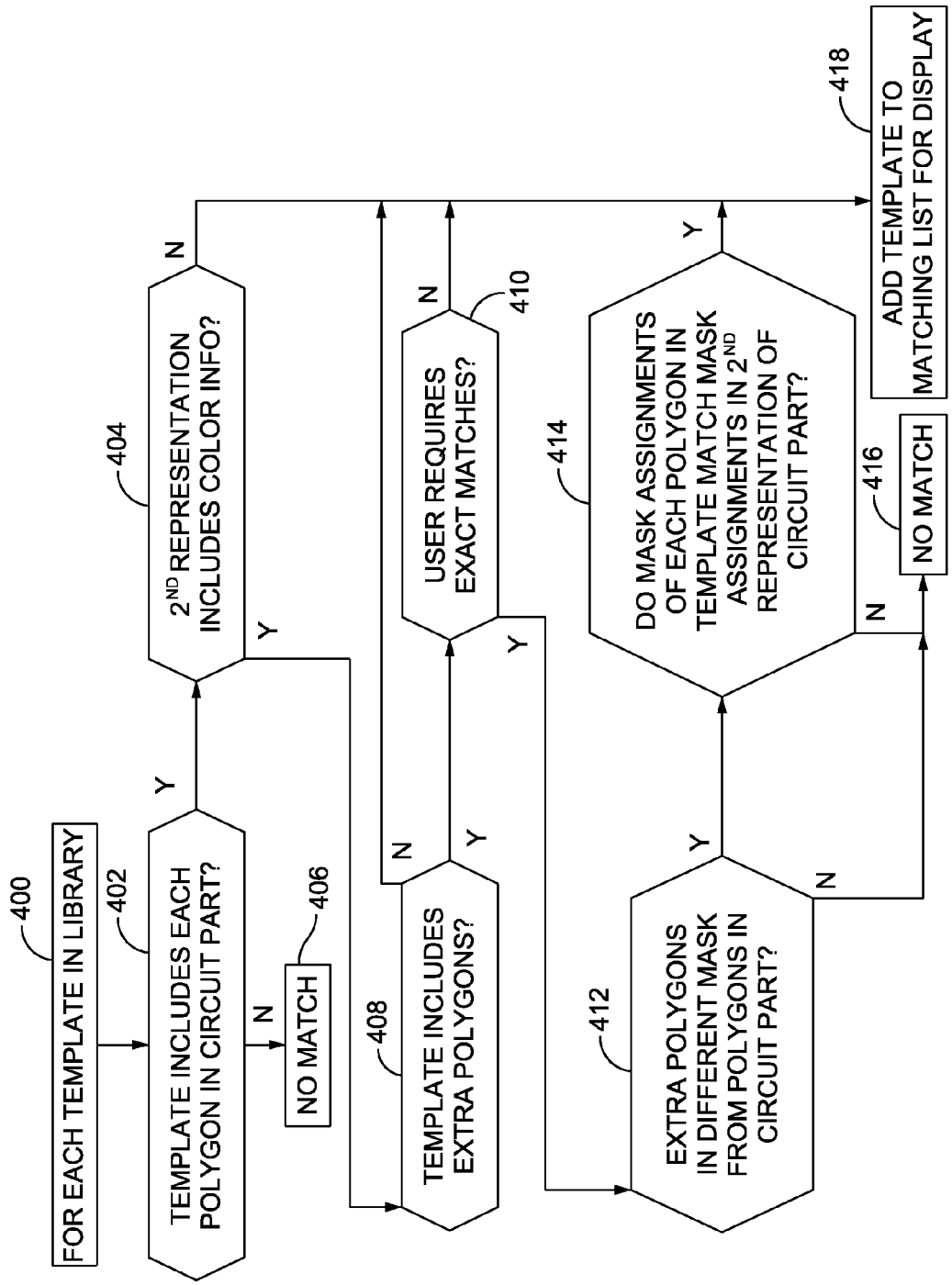
FIG. 4 is a flow chart of the block 306 of FIG. 3, according to some embodiments.

FIG. 4 is a flow chart showing matching criteria that can be used by the matching module.

At step 400, a loop is repeated for each template in the library 118.

At step 402, a determination is made whether the template includes each polygon in the circuit part 126. If the result is .TRUE., then step 404 is performed. If the result is .FALSE., then step 406 is performed.

At step 404, a determination is made whether the second (bit stream) representation of the IC design includes color (multi-patterning mask assignment) information. If the result is .TRUE., then step 418 is performed. If the result is .FALSE., then step 408 is performed.

At step 406, there is no match, and this iteration of the loop is completed. If there are more templates in the library, then control returns to step 400.

At step 408, a determination is made whether the library template includes polygons that are not included in the part of the IC design 126 to be matched. If the result is .TRUE., then step 410 is performed. If the result is .FALSE., then step 418 is performed.

At step 410, a determination is made whether the user requires an exact match of the patterns and masks. If the result is .TRUE., then step 412 is performed. If the result is .FALSE., then step 418 is performed.

At step 412, a determination is made whether the extra polygons in the template are assigned to a different mask from the polygons which correspond to the polygons in the part of the IC design 126. If the result is .TRUE., then step 414 is performed. If the result is .FALSE., then step 416 is performed.

At step 414, a determination is made whether the mask assignments of each polygon in the template match the mask assignments in the bit stream representation of the IC design 126. If the result is .TRUE., then step 418 is performed. If the result is .FALSE., then step 416 is performed.

At step 416, there is no match, and this iteration of the loop is completed. If there are more templates in the library, then control returns to step 400.

At step 418, the template is added to the matching 111 for display. If there are more templates in the library, then control returns to step 400.

In some embodiments, the representation of the IC design 126 does not include multi-patterning mask assignment information. In this scenario, matching module 110 is configured to identify a matching set 111 containing each of the plurality of templates 122A-122I in the template library 118 that at least includes patterns matching all of the plurality of polygons in the part of the circuit 126, regardless of whether any of the individual templates includes a pattern matching all of the plurality of polygons in the part of the circuit within a single photomask, and regardless of whether the patterns within one of the templates in the matching set are divided among two or more photomasks.

Further, the matching module 110 includes in the matching set 111 each of the plurality of templates 122A-122I that at least includes patterns matching all of the plurality of polygons in the part of the circuit 126, regardless of whether any of the individual patterns includes two or more polygons that are closer to each other than a minimum separator distance for forming polygons with a single photomask. Because the patterns in the template library have already been assigned to different masks in ways that permit the patterns formed by each individual mask to be formed clearly, any minimum separator distance issues have already been resolved prior to acceptance of the templates 122A-122I for inclusion in the template library 118.

Figure 5:
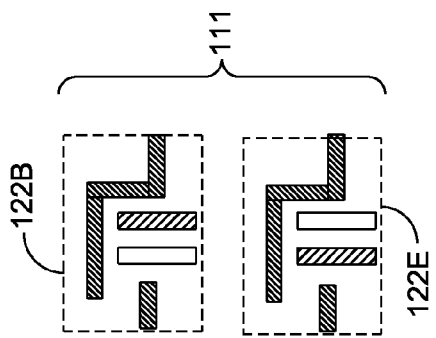
FIG. 5 shows an example of the operation of the system in a first scenario, according to some embodiments.
Figure 5:
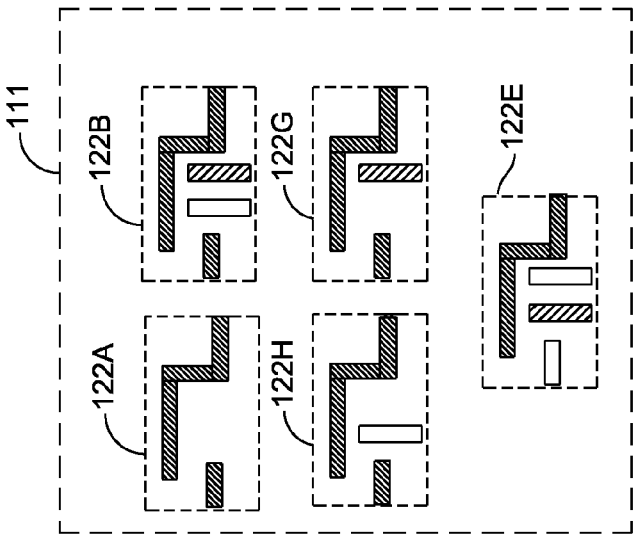
Figure 5:
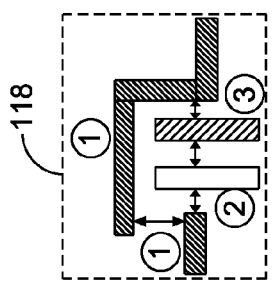
Figure 6:
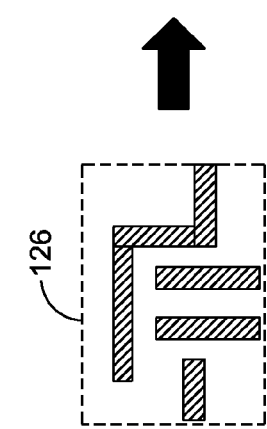
FIG. 6 schematically shows an example of the operation of the system in a second scenario, according to some embodiments.

FIGS. 5 and 6 show two examples of matching sets selected to include each of the plurality of templates 122A-122I that at least includes patterns matching all of the plurality of polygons in the part of the circuit 126, regardless of whether the patterns within one of the templates in the matching set are divided among two or more photomasks. In FIG. 5, the IC design 126 has already gone through the place and route tool process of the EDA tool, and the part of the circuit 126 includes four polygons. The circuit design 126 of FIG. 5 does not have color information. That is, the allocation of the polygons to multiple photomasks is not specified in the part of the circuit design 126. If the matching module 110 compares this pattern 126 against the nine pattern templates 122A-122I in the template library 118, there are only two templates which include all of the four polygons shown in the part of the circuit design 126, namely the templates 122B and 122E. Note that the mask assignments in these two templates are different from each other, but either can be formed using three photomasks, and both match the part of the design 126. Thus matching module 110 includes both the templates 122B and 122E in the matching set 111 for this scenario.

In FIG. 6, the part of the circuit 126 only includes two polygons. Like the scenario of FIG. 5, the part of circuit design 126 does not have color information. The allocation of the polygons to multiple photomasks is not specified. If the matching module 110 compares this pattern 126 against the nine pattern templates 122A-122I in the template library 118, there are five templates which include both polygons, namely templates 122A, 122B, 122E, 122G and 122H. Thus matching module 110 stores the patterns 122A, 122B, 122E, 122G and 122H for this scenario.

Figure 7:
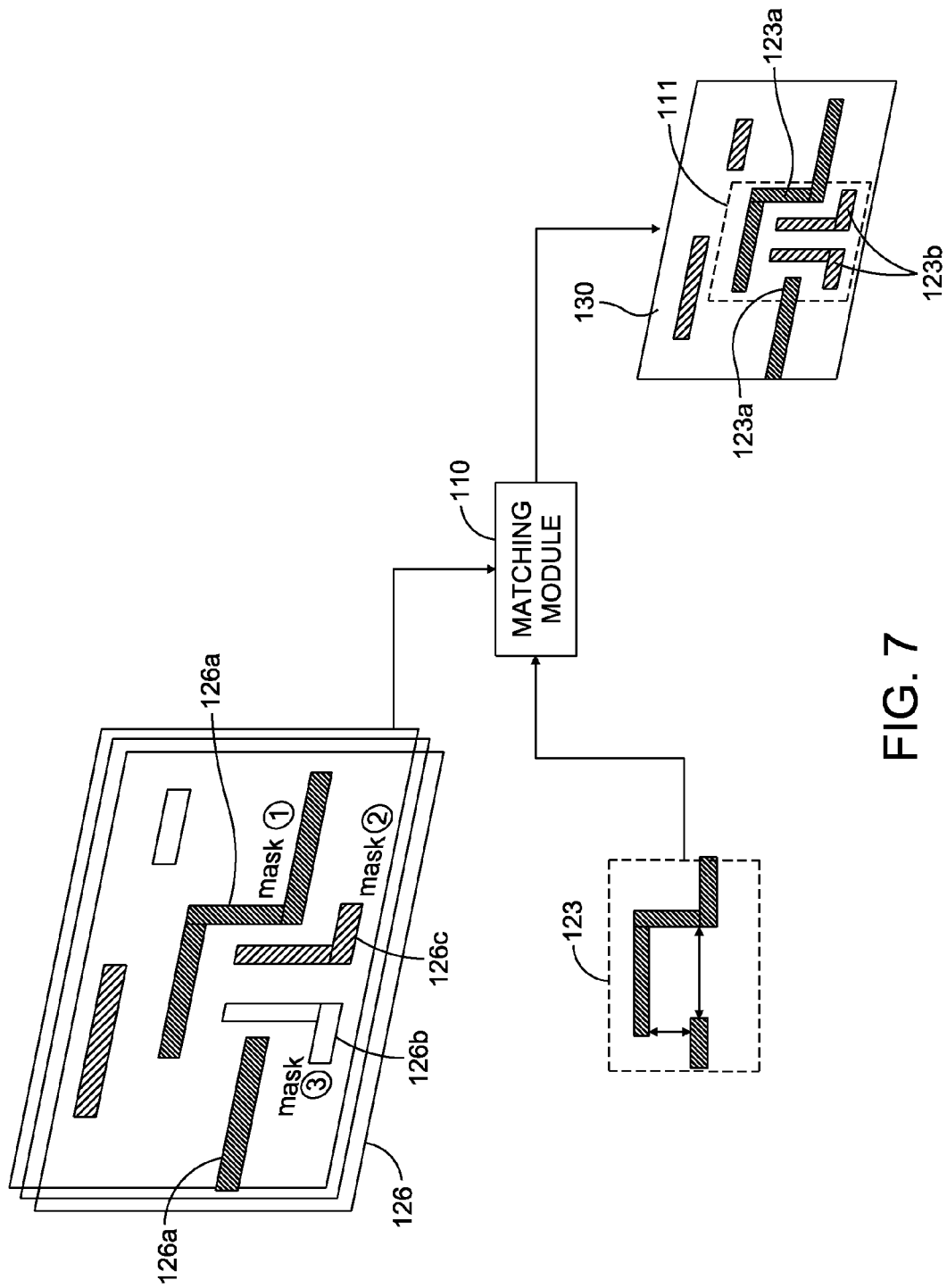
FIG. 7 schematically shows an example of the operation of the system in a third scenario, according to some embodiments.
Figure 8A:
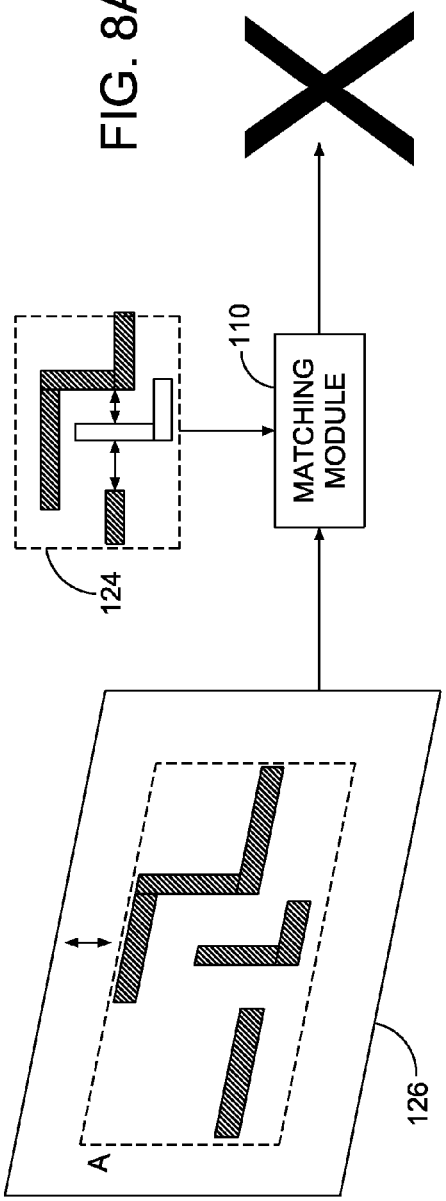
FIG. 8A schematically shows an example of the operation of the system in a fourth scenario, according to some embodiments.
Figure 8B:
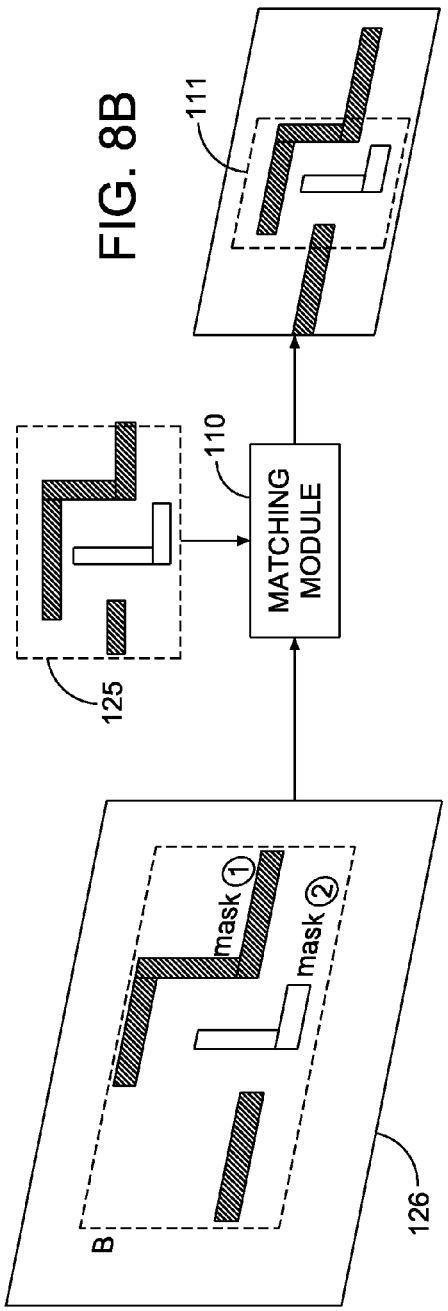
FIG. 8B schematically shows an example of the operation of the system in a fifth scenario, according to some embodiments.

In some embodiments, the second (e.g., bit stream) layout representation of the part of the circuit 126 includes data identifying on which photomask each of the plurality of polygons is to be located. Thus, the IC design 126 has already gone through place and route and multi-patterning decomposition, and the mask assignment information is provided with the second layout representation (e.g., GDSII or OASIS bit stream) of the circuit. In some embodiments, the matching module 110 is configured to receive the second layout representation including the data identifying on which photomask each of the plurality of polygons is to be located, and to provide additional matching options. FIGS. 7, 8A and 8B show examples in which the matching module uses this information.

In some embodiments, the matching module gives the user the option to request that the matching module 110 provide any template that matches the polygons assigned to a single mask of the part of the IC design 126, and to ignore differences between the IC design and the template for any patterns assigned to other photomasks in IC design or the template. Thus, the matching module 110 includes in the matching set 111 each of the plurality of templates in library 118 that includes a pattern matching at least one of the plurality of polygons in the part of the circuit, regardless of whether any of the individual templates includes patterns matching all of the plurality of polygons to be formed within the photomask containing the at least one polygon.

FIG. 7 is an example of this option. Thus, the matching module 110 displays on display 112 an option for the user to request a match for the polygons in one of the photomasks. If the user selects this option, the user is asked to select which hyper layer (photomask) of the IC design is to be matched against the templates 122A-122I in library 118. In FIG. 7, the part of the IC design 126 is displayed with the color information, either graphically or textually identifying on which photomask each polygon will be formed. The information indicates that polygons 126a are formed on mask 1, polygon 126b is on mask 3, and polygon 126c is on mask 2. The user can use the input device 114 to select one of the masks. In the scenario of FIG. 7, the user requests a match for the patterns 126a of mask 1, regardless of whether the portions of the templates in masks 2 and 3 match. Thus, matching module 110 searches for any template 123 which has a match for the patterns 126a of mask 1. The matching module 110 will return any template which is an exact match, as well as any template for which the mask provides a pattern exactly matching polygons 126a plus additional patterns in mask 1. Since there may not be an exact match, allowing the user to choose among templates which have extra patterns in the selected mask increase the likelihood of finding an acceptable template. In this case, the matching set 111 includes a template having both the exactly matching polygons 123a (corresponding to polygons 126a of IC design 126), as well as two additional polygons 123b in mask 1, which were not included in the original IC design.

Note that the option of FIG. 7 can provide a matching template that would not be found if the user were only given the option to search for templates having a mask 1 that exactly matches mask 1 of the IC design 126. The user (or other source of the template 123) has already determined that the template will provide acceptable results when incorporated into an IC design (Thus, the use of reusable templates containing verified components simplifies verification). For various reasons, the initial multi-patterning decomposition performed by the EDA tool may assign the patterns 126b and 126c to the third and second masks, but the matching module allows the user to override this assignment with a template, for example to take advantage of an equivalent single mask version of the pattern that may be available.

In some embodiments, the matching module includes in the matching set each of the plurality of templates that includes a pattern matching at least one of the plurality of polygons in the part of the circuit. This option provides the user the largest matching set 111 from which to choose a template or refine a template then substitute into the updated IC design 130.

In some embodiments, the matching module gives the user the option to request an exact match, so that the matching set only includes a template that includes every pattern in the part of the circuit 126, assigned to the same mask as indicated in the mask assignment information of the IC design second layout representation. Using this option, the user can take a more conservative approach to avoid possible false matches, where either the original multi-patterning decomposition or the template may have incorrectly determined that all polygons in the pattern can be formed on the same photomask.

The matching module 110 is configured to cause the templates and polygons to be displayed in a manner that identifies on which photomask each portion of each pattern and each polygon of the part of the circuit is to be located.

FIGS. 8A and 8B provide examples using this option. In FIGS. 8A and 8B, the polygons of the part of the IC design 126 are identical, but in FIG. 8A, all of the polygons have been assigned to be formed on the same photomask, whereas in FIG. 8B, the polygons are divided among two masks.

In FIG. 8A, if the matching module tries to match the single-mask IC design against a template 124 in which the polygons are split between two masks, the result is no match. Although not shown in FIG. 8A, the same result is reached if the IC design divides the polygons among two masks, but the template 124 only uses a single mask (or three masks).

FIG. 8B shows the case in which the IC design divides the polygons among two masks. Thus, as shown in FIG. 8B, a match is identified if the template being compared to the IC design includes the same polygons divided the same way among the photomasks, but other templates assigning all of the polygons to the same photomask are not indicated to be a match. Thus, the matching module includes in the matching set each of the plurality of templates that at least includes a pattern matching at least one of the plurality of polygons in the part of the circuit, so long as the template does not include within a single photomask a pattern corresponding to two polygons that are to be located in two different photomasks according to the data of the second layout representation identifying on which photomask each of the plurality of polygons is to be located.

Matching module 110 may employ a variety of pattern matching techniques. Different algorithms may use different "key definitions" of the layout template to identify whether a pattern template matches a given part of an IC design layout definition. For example, two methods are pixel based pattern recognition, and edge/vertex based pattern recognition.

In pixel based systems, patterns are characterized by the pixel distribution within a region. For example, given an m×n rectangular region, the region can be represented by a two-dimensional array of pixels, each having a value of 0 (no metal) or 1 (metal). A hash function can be used to determine a hash value associated with each possible configuration of polygons (combination of 0's and 1's) in the region. Thus, each pattern template has a respective hash value. The hash function is also applied to the part of the IC design 126 to be matched against the library templates. The hash value of the part of the IC design 126 is then easily compared to the hash value of each of the templates.

An example of an edge/vertex based technique is described in "Calibre Pattern Matching," by Mentor Graphics Corporation, Wilsonville, Oreg., 2010, which is incorporated by reference herein.

The above described pattern recognition techniques are used to compare patterns on a single layer. In cases where the IC design GDSII layout representation does not have multi-patterning information, the templates can be compared to the IC design by two alternatives. In some embodiments, when the IC design has no color information, the various patterns in each hyper layer of the template can be combined into a single combined layer for purpose of matching. Once the matching set is determined, the library templates can be displayed to the user including the color (mask assignment) information, for use by the user when selecting a template. This technique will produce more matches. In other embodiments, each hyper layer (containing the polygons formed on a single mask of the template) is treated as a separate pattern and matched against the IC design. This produces fewer matches, because it is looking for a match within one layer.

In cases where the GDSII representation of the IC layout includes the color (mask assignment) information, the mask aware pattern recognition discussed above with reference to FIGS. 7, 8A and 8B is used. Thus, the user can be given the option to have the matching module 110 ignore extra patterns that are assigned to different photomasks (different hyper layers) of the IC design. This will result in a larger number of templates being included in the matching set 111. The matching module will compare each hyper layer of the template individually to the part of the IC design. If any of the hyper layers includes all of the polygons of the selected layer of the part of the IC design, the template is added to the matching set 111. The results of comparing the IC design to each hyper layer of the template are OR'ed.

Alternatively, if the user requests an exact match, the results of comparing the IC design to each hyper layer of the template are AND'ed. For an exact match, the criterion is whether each hyper layer of the IC design matches a corresponding hyper layer of the template.

In some embodiments, apparatus comprises a persistent machine readable storage medium for storing a template library having at least one template. The template is to include a first layout representation of at least one pattern to be formed by multi-patterning a single layer of a IC. The pattern has a plurality of portions to be formed using a plurality of respectively different photomasks. The first layout representation includes data identifying on which photomask each portion is to be located. An electronic design automation (EDA) tool includes a processor configured to receive a hardware description language representation of at least a part of a circuit and generate a second layout representation of the part of the circuit having a plurality of polygons. The EDA tool has a matching module that identifies and outputs an indication of whether one or more of the plurality of portions matches a subset of the plurality of polygons.

In some embodiments, a method comprises providing a persistent machine readable storage medium that stores a template library containing at least one template including a first layout representation of at least one pattern to be formed by multi-patterning a single layer of an IC. The pattern has a plurality of portions to be formed using a plurality of respectively different photomasks. The first layout representation includes data identifying on which photomask each portion is to be located. An electronic design automation (EDA) tool is used to generate a second layout representation of a part of a circuit having a plurality of polygons. The tool identifies and outputs an indication of whether one or more of the plurality of portions matches a subset of the plurality of polygons.

In some embodiments, a persistent machine readable storage medium encoded with computer program code. When the computer program code is executed by a processor, the processor performs a method comprising providing a persistent machine readable storage medium that stores a template library containing at least one template including a first layout representation of at least one pattern to be formed by multi-patterning a single layer of an IC. The pattern has a plurality of portions to be formed using a plurality of respectively different photomasks. The first layout representation includes data identifying on which photomask each portion is to be located. An electronic design automation (EDA) tool is used to generate a second layout representation of a part of a circuit having a plurality of polygons. The tool identifies and outputs an indication of whether one or more of the plurality of portions matches a subset of the plurality of polygons.

The methods and system described herein may be at least partially embodied in the form of computer-implemented processes and apparatus for practicing those processes. The disclosed methods may also be at least partially embodied in the form of tangible, non-transient machine readable storage media encoded with computer program code 119. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that the computer becomes a special purpose apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. Apparatus comprising:
an electronic design automation (EDA) tool comprising a computer configured to receive a first representation of at least a part of a circuit and generate a layout representation of the part of the circuit having a plurality of polygons,
the EDA tool configured to identify and output an indication of whether shape information of one or more of a plurality of portions of a previously stored template that includes shape and mask assignment information, for multi-patterning a single layer of an integrated circuit (IC) using a plurality of respectively different masks, matches a subset of the plurality of polygons of the layout representation of the part of the circuit, the identifying performed after the layout representation is generated, wherein the mask assignment information identifies on which one of the plurality of masks each of the plurality of portions is to be located.

2. The apparatus of claim 1, wherein:
the previously stored template includes a respective first layout representation of a respective pattern, the pattern having one or more portions to be formed using the plurality of respectively different masks;
the EDA tool is configured to identify a match if the template at least includes a pattern matching all of the plurality of polygons in the part of the circuit.

3. The apparatus of claim 2, wherein:
the EDA tool has a matching module configured to include in a matching set each of a plurality of templates that at least includes patterns matching all of the plurality of polygons in the part of the circuit.

4. The apparatus of claim 2, wherein:
the matching module is configured to identify a match, if the template includes a first group of patterns matching all of the plurality of polygons in the part of the circuit and a second group including at least one additional pattern that does not match any of the plurality of polygons in the part of the circuit.

5. The apparatus of claim 2, wherein:
the EDA tool is configured to cause displaying of each of a plurality of templates, where each of the plurality of templates at least includes a pattern matching all of the plurality of polygons in the part of the circuit.

6. The apparatus of claim 5, wherein:
the EDA tool is configured to respond to a selection by a user of one of the displayed templates by replacing the plurality of polygons in the part of the circuit with the template corresponding to the selection.

7. The apparatus of claim 5, wherein:
the matching module is configured to cause the plurality of templates and plurality of polygons to be displayed in a manner that identifies on which mask each portion of each pattern and each polygon of the part of the circuit is to be located.

8. The apparatus of claim 1, wherein:
the layout representation includes data identifying on which mask each of the plurality of polygons is to be located.

9. The apparatus of claim 1, wherein:
the EDA tool has a matching module that includes in a matching set each of a plurality of templates that includes a pattern matching at least one of the plurality of polygons in the part of the circuit.

10. The apparatus of claim 1, wherein:
the EDA tool has a matching module that includes in a matching set each template that includes a pattern having a mask assignment and matching at least one of the plurality of polygons in the part of the circuit and a mask assignment thereof, respectively.

11. The apparatus of claim 1, wherein:
the EDA tool has a matching module that includes in a matching set each template that at least includes a respective pattern matching each respective one of the plurality of polygons in the part of the circuit, wherein each respective one of the plurality of polygons matches a respective pattern in the template.

12. A method comprising:
using an electronic design automation (EDA) tool comprising a computer to generate a layout representation of a part of a circuit having a plurality of polygons: and
identifying and outputting an indication of whether shape information of a plurality of portions of one or more previously stored templates containing shape and mask assignment information for multi-patterning a single layer of an integrated circuit using two or more different masks matches a subset of the plurality of polygons of the layout representation of the part of the circuit, the identifying performed after the layout representation is generated, wherein the mask assignment information identifies on which one of the plurality of masks each of the plurality of portions is to be located.

13. The method of claim 12, wherein:
the one or more previously stored templates are included in a library having a plurality of templates, each including a respective first layout representation of a respective pattern, each pattern having one or more portions to be formed using the two or more different masks, the method further comprising:
identifying a matching set containing one or more of the plurality of templates that at least include patterns matching all of the plurality of polygons in the part of the circuit.

14. The method of claim 13, wherein:
each pattern in each template in the matching set matches a corresponding polygon in the part of the circuit.

15. The method of claim 12, wherein outputting the indication includes displaying each template that at least include patterns matching all of the plurality of polygons in the part of the circuit; and the method further comprises:
receiving a selection by a user of one of the displayed templates; and
responding to the selection by replacing the plurality of polygons in the part of the circuit with the template corresponding to the received selection.

16. The method of claim 15, wherein:
the outputting further comprises displaying each polygon in the part of the circuit, and
the displayed templates and the displayed polygons are each displayed in a manner that identifies on which mask each portion of each pattern and each polygon of the part of the circuit is to be located.

17. The method of claim 12, wherein:
the layout representation includes data identifying on which mask each of the plurality of polygons is to be located; and
the identifying step identifies a matching set that includes each of the one or more templates that at least includes a pattern matching at least one of the plurality of polygons in the part of the circuit, wherein said each of the one or more templates does not include within a single mask a pattern corresponding to two polygons that are to be located in two different masks according to the data of the layout representation identifying on which mask each of the plurality of polygons is to be located.

18. A non-transitory machine readable storage medium encoded with computer program code, such that, when the computer program code is executed by a processor, the processor performs a method comprising:
using an electronic design automation (EDA) tool comprising a computer to generate a layout representation of a part of a circuit having a plurality of polygons: and
identifying and outputting an indication of whether shape information of a plurality of portions of one or more previously stored templates containing shape and mask assignment information for multi-patterning a single layer of an integrated circuit using two or more different masks matches a subset of the plurality of polygons of the layout representation of the part of the circuit, the identifying performed after the layout representation is generated, wherein the mask assignment information identifies on which one of the plurality of masks each of the plurality of portions is to be located.

19. The non-transitory machine readable storage medium of claim 18, wherein:
the method further comprises identifying a matching set containing one or more of the plurality of templates that at least includes patterns matching all of the plurality of polygons in the part of the circuit, and the matching set excludes one or more templates that have one or more additional patterns that do not match a corresponding polygon in the part of the circuit.

20. The non-transitory machine readable storage medium of claim 19, wherein:
- the method further comprises displaying each template in the matching set and displaying each polygon in the part of the circuit, and
- the plurality of templates and plurality of polygons are each displayed in a manner that identifies on which mask each portion of each pattern and each polygon of the part of the circuit is to be located, and the method further comprises:
- receiving a selection by a user of one of the displayed templates; and
- responding to the selection by replacing the plurality of polygons in the part of the circuit with the selected template.

* * * * *